United States Patent [19]

Mamodaly et al.

[11] Patent Number: 4,839,712
[45] Date of Patent: Jun. 13, 1989

[54] COMPACT COMBINER FOR SEMICONDUCTOR DEVICES OPERATING IN THE ULTRA-HIGH FREQUENCY RANGE

[75] Inventors: Narquise Mamodaly, Paris; Alain Bert, Gif sur Yvette, both of France

[73] Assignee: Thomson-CSF, Paris, France

[21] Appl. No.: 35,237

[22] Filed: Apr. 6, 1987

Related U.S. Application Data

[63] Continuation of Ser. No. 721,745, Apr. 15, 1985, abandoned.

[30] Foreign Application Priority Data

Apr. 13, 1984 [FR] France .................. 84 05905

[51] Int. Cl.⁴ .................................. H01L 27/02
[52] U.S. Cl. ........................... 357/51; 357/75; 357/80; 333/247; 381/96; 381/117 D
[58] Field of Search ............... 357/51, 75, 80; 333/247; 381/96, 117 D

[56] References Cited

U.S. PATENT DOCUMENTS

| | | | |
|---|---|---|---|
| 3,826,953 | 7/1974 | Le Gales | 357/75 |
| 4,042,952 | 8/1977 | Kraybill | 357/68 |
| 4,067,040 | 1/1978 | Tsuzuki et al. | 357/80 |
| 4,172,261 | 10/1979 | Tsuzuki et al. | 357/81 |
| 4,200,880 | 4/1980 | Frey | 357/51 |
| 4,259,684 | 3/1981 | Dean et al. | 357/80 |

FOREIGN PATENT DOCUMENTS

| | | |
|---|---|---|
| 1890 | 6/1980 | European Pat. Off. . |
| 104995 | 4/1984 | European Pat. Off. . |
| 2377137 | 4/1978 | France . |

OTHER PUBLICATIONS

R. Tenenholtz, "Designing Megawatt Diode Duplexers", Microwave Journal, vol. 22, No. 1, Jan., 1979, pp. 63–68.

*Primary Examiner*—Edward J. Wojciechowicz
*Attorney, Agent, or Firm*—Pollock, VandeSande & Priddy

[57] ABSTRACT

The invention relates to a compact combiner for ultra-high frequency semiconductor devices, such as negative resistance diodes (Gunn - Impatt). The combiner according to the invention combines on a base: at least one semiconductor pellet or a plurality of semiconductor devices integrated into a single pellet at the center of the base, a first ring of capacitors as located elements, a second dielectric material ring metallized on two opposite planar faces, forming both a second capacitor and part of the encapsulation box of the combiner; and metal tapes ensuring the connections between the active components and the capacitors and simultaneously forming non-located element chokes. A metal cover welded to the outer ring seals the box and supplies the bias. The compact combiner may be used in applications of ultra-high frequency amplifiers and oscillators.

8 Claims, 3 Drawing Sheets

COMPACT COMBINER FOR SEMICONDUCTOR DEVICES OPERATING IN THE ULTRA-HIGH FREQUENCY RANGE

This application is a continuation, of application Ser. No. 721,745, filed Apr. 10, 1985, now abandoned.

The present invention relates to a compact combiner for ultra-high frequency semiconductor devices in the millimeter wave range, such as, e.g. the K band of 11 to 33 GHz.

The power available at the output of this combiner is obtained by means of at least one semiconductor device, which is impedance prematched by a cell having two chokes and two capacitors, one of the latter being formed by a ceramic ring metallized on two opposite faces and forming part of the combiner encapsulation box.

The combiner according to the invention is a component used in the construction of more complex systems, such as oscillators or amplifiers and combines negative resistance elements, such as avalanche, Gunn or impact diodes.

The object of the invention is to provide very high power levels, bearing in mind the frequencies considered, i.e. several dozen Watts mean or several hundred Watts peak. However, it is known that at millimeter frequencies, the chips of the semiconductor devices are very small due to their working frequency and consequently they only dissipate a low power. Therefore, in order to obtain a higher power level, it is necessary to combine several semiconductor chips, or to adapt a device which, on a single chip, combines the equivalent of several small chips with the necessary prematching.

Combiners are known, particularly from French Patent applications Nos. 7,908,790 and 8,216,296 filed by the present Applicant. In the first of these specifications, the combiner combines semiconductor devices connected in parallel and which are prematched by microstrip lines deposited on a substrate. The configuration of this combiner is similar to that of a circuit formed on a flat substrate, such as printed circuits and, maintaining all the proportions, is too large due to the microstrip lines, whose length is equal to a quarter or half the wavelength corresponding to the working frequency. Thus, in the second aforementioned specification, the combiner is placed in a conventional cylindrical box provided for encapsulating a semiconductor device chip, but the substrate carrying the chips is made from a dielectric material whose dielectric constant is chosen in such a way that the microstrip lines can be folded and arranged substantially concentrically to the chips grouped in the center of the box. Thus, there is a space gain, although said combiner still uses microstrips.

The combiner according to the invention combines several parallel-connected semiconductor chips, or a single chip fulfilling the same function as several chips which are not separated in a configuration ensuring the impedance transformation. Impedance matching is obtained by means of a double cell L-C for each semiconductor device, the chokes L being constituted by connecting tapes or wires between the chip and the capacitor C, whereof one is block location element capacitor and the other is formed by a ring of dielectric material, which is metallized on its two opposite faces. This ring, placed between the metal base and the metal cover by which the bias is supplied, constitutes the encapsulation box of the combiner. This prematching system is more compact than a microstrip system and makes it possible to receive within a given box, larger semiconductor chips than in the case where no prematching was provided, so that it makes it possible to supply more power.

SUMMARY OF THE INVENTION

The present invention specifically relates to a compact combiner for semiconductor devices operating in the ultra-high frequency range and which has, fixed to a metal base, at least one semiconductor chip and at least one impedance prematching cell formed by two chokes in series and two capacitors in parallel, each capacitor being connected between a choke and earth, wherein the first capacitor of each impedance prematching cell is a block location element fixed to the base, the second capacitor, which is common to all the impedance prematching cells, is a location element formed by a dielectric material ring metallized on two opposite planar faces, which is fixed to the base and concentric to the combiner and the chokes are non-located elements, formed by metal tapes thermally compressed between a chip and the first capacitor for the first choke and between the first and second capacitors for the second choke.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
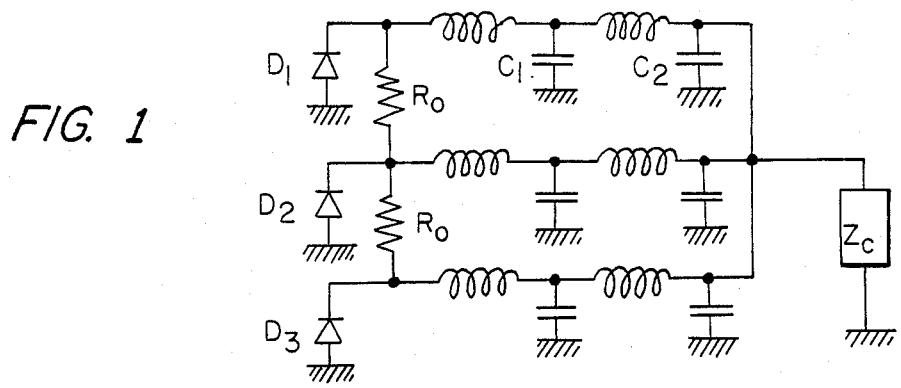
FIG. 1 an electric circuit diagram of a combiner according to the invention.

In order to obtain power levels of several dozen Watts mean with solid state components, it is necessary to combine several components and there are several ways to carry this out. Thus, it is possible to combine several chips encapsulated outside the box, such as, e.g. combinations of the Kurokawa or Braddock Hodges types, in which the energy supplied by separate chips is concentrated by means of two or three-dimensional waveguides. It is also possible to carry out a combination with respect to the chips and this can be considered in two following forms. Combination of several chips, each of surface S', the equivalent overall surface then being S=nS', n being the number of combined chips. This type of combination can, e.g. be obtained by cutting the chips in groups of four instead of individually, which gives four juxtaposed semiconductor devices on a single chip. The other form is to use a single chip of surface S equivalent to the surface defined hereinbefore but wherein said chip is of an adapted shape, according to which the semiconductor devices are combined into a single equivalent semiconductor device. For example, instead of having four juxtaposed diodes on the same chip, there is only a single annular diode, the surface of the ring being equivalent to the surface of the four aforementioned diodes. The advantage of using a single chip is that the thermal resistance of the semiconductor device is dependent on the mean radius, e.g. in the case of an annular diode.

With respect to the chip, there are two reasons why it is not possible to excessively increase the surface, in order to increase the available energy. The first reason is that the matching of a semiconductor device becomes more difficult as its surface increases. Thus, the impedance of an avalanche diode is low and inversely proportional to its surface. The more the surface increases, the more the impedance of the diode decreases and the more the external circuit has to provide a low impedance.

The second reason is that the notion of identical efficiency between a plurality of chips and a single chip combining several semiconductor devices is not satisfactory. In order to maintain the same efficiency, it is necessary to increase the polarizing current, which leads to heating in the vicinity of the junction. This heating leads to a junction temperature rise, said temperature being proportional to the product of the power applied by the thermal resistance, which does not, e.g. decrease by half when the surface doubles. Beyond a certain surface area, it is consequently impossible to retain an identical efficiency without modifying the diode topology. One of the solutions, which has already been mentioned and which will be explained in greater detail hereinafter, consists of adopting an annular topology. The thermal resistance is then improved by acting on the total surface and on the mean diameter of the ring.

With respect to the box combining a plurality of chips, three combination arrangements can be envisaged, namely combining several chips in series or in parallel and the addition of a plurality of semiconductor devices produced in integrated form with the aid of a chip having a different topology and a larger surface, which is the case of the annular diode referred to hereinbefore.

With regards to the arranging in series of a plurality of diodes, significant results have been obtained in the laboratory by arranging in series four chips joined to a diamond support. The technology is complicated and attempted simplifications have come up against performance limitations.

The most interesting arrangement and that used by the combiner according to the invention is the combination of a plurality of parallel-connected semiconductor devices, or semiconductor devices combined in integrated form on a single chip. In this case, a device ensures the impedance transformation necessary for adapting the combiner to its environment in a more complex system and for balancing the powers supplied by each chip. This device can be designed either with the aid of non-located elements, such as, e.g. chokes on connection lines, or with the aid of located elements, which are essentially the chips on or in which are formed the semiconductor devices or capacitors.

This is shown in FIG. 1, which is the electric circuit diagram of the combiner according to the invention. A plurality of diodes $D_1$, $D_2$, $D_3$ . . . are connected in parallel to supply their energy to an impedance load $Z_C$.

However, in order to balance the available powers and due to the minor variations which can exist between the characteristics of the diodes $D_1$, $D_2$, $D_3$ . . . ballast resistors $R_0$ are connected between the cathodes of these diodes. Each of the diodes is connected to the impedance load $Z_C$ by an impedance prematching cell, which is itself formed by two cascade-connected networks $L_C$, the chokes $L_1$ and $L_2$ being connected in series and the capacitors $C_1$ and $C_2$ in parallel between chokes $L_1$ and $L_2$ and earth.

The function of the resistors $R_0$ incorporated into this diagram is to prevent oscillations on the asymmetric modes, or their prejudicial repercussions on the operation of the combiner on the fundamental mode. However, they are "transparent" for the symmetrical mode, and the arrangement according to the diagram of FIG. 1 behaves in the same way as if a plurality of diodes was connected in parallel to the terminals of a single prematching cell connected to the output load.

Knowing the impedance of the diodes and that provided by the external circuit $Z_C$, it is possible to calculate the transformation ratio to be provided by the impedance prematching cells, i.e. the transformation of a low impedance into a high impedance. On the basis of this transformation ratio, the values of the located elements of the cells are calculated, i.e. essentially the values of capacitors $C_1$ and $C_2$. The chokes are produced by means of connecting wire or tapes and within a certain range, their value is imposed by the dimensions of the combiner. Thus, preferably the values of capacitors $C_1$ and $C_2$ are calculated for matching to the combiner.

The essence of the invention is a construction topology making it possible to combine several diodes or integrate a diode of different shape and equivalent surface in order to form a combiner in a compact box.

Figure 2:
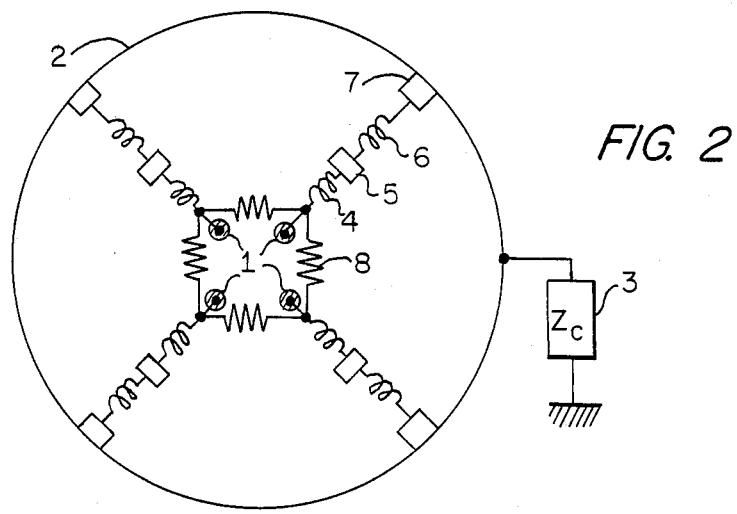
FIG. 2 the assembly drawing of a combiner according to the invention in a first embodiment.

FIG. 2 is the assembly device of a combiner according to a first embodiment of the invention. This combiner combines a plurality of semiconductor chips 1. There are four diodes in FIG. 2, but this is only intended as an example and in no way limits the scope of the invention or the number of semiconductor devices combined in the combiner. These diodes are connected in parallel to an energy collector 2, which is itself connected to the external load 3 of impedance $Z_C$. Each of the diodes is connected to the energy collector 2 via a cell formed by a first choke 4 and a first capacitor 5 in series with a second choke 6 and a second capacitor 7. Ballast resistors 8 can be connected between the diodes, but this is not necessary and merely constitutes a variant in the case where the characteristics of the diodes are not sufficiently balanced with one another.

The diode chips are shown in the form of a circle in FIG. 2 and this constitutes a simplified representation of diodes cut in a wafer of semiconductor material, on which they are produced collectively. These diodes can be separately connected to a base, not shown in FIG. 2, or can be collectively cut so as to form only a single chip. Around the central group formed on the base by the plurality of diode chips is fixed a plurality of capacitor blocks 5, which are connected to the diodes by wires or tapes 4. The second capacitors 7, at a rate of one capacitor per prematching cell, are produced collectively in the form of a ceramic ring and more precisely a dielectric material ring, which constitutes part of the combiner encapsulation box. This dielectric material, to which further reference will be made hereinafter, is metallized on two opposite faces parallel to the substrate plane. Thus, the two metallizations and the dielectric material form a capacitor. Moreover, the metallizations are used for welding the ring both to the base and to the cover.

Figure 3:
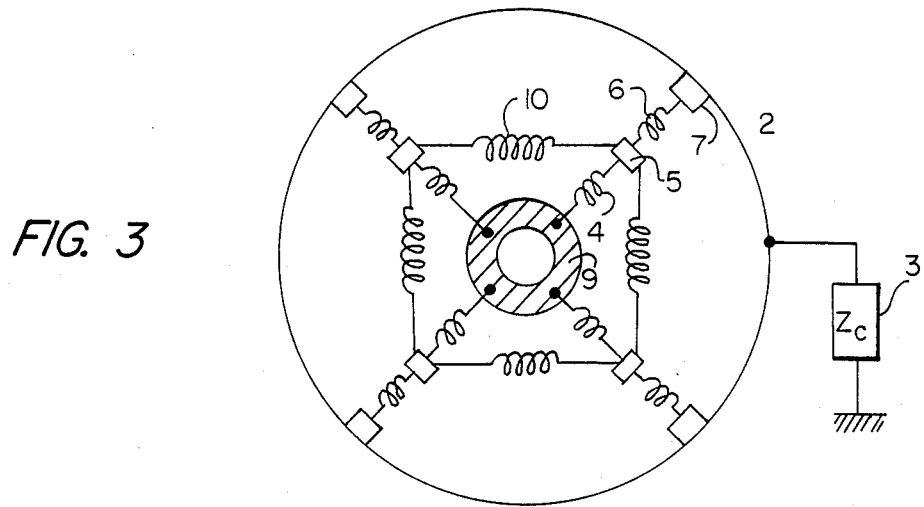
FIG. 3 an assembly drawing of a combiner according to the invention in a second embodiment.

FIG. 3 shows an assembly drawing of a second embodiment of a combiner according to the invention. In this case, the plurality of diodes, as represented by the first embodiment in FIG. 2, is replaced by what could be called an integrated diode circuit, i.e. a single diode chip 9, whose surface is equivalent to the sum of the surfaces of the elementary diodes 1. The difference is that the mean diameter of the ring spread in said chip to form the single diode is larger than the mean diameter of the elementary diodes 1, which permits a better heat dissipation. However, the impedance prematching circuits are the same, i.e. each circuit has a choke 4 and a capacitor 5 in cascade with a choke 6 and a capacitor 7.

However, in the case of FIG. 3 where a plurality of discrete diodes are combined to form a single circular integrated equivalent diode, capacitors 5 can also be combined into a single circular capacitor 5, as will be described in greater detail relative to FIG. 7.

Through the plurality of elementary diodes 1 being replaced by a single annular diode 9, it is no longer necessary or useful in certain cases, to provide ballast resistors 8, as in the case of the previous drawing. However, and as a function of the embodiment, it can be useful to connect the capacitors 5 by electrical connections, e.g. in the form of wires, so as to distribute the potentials of these capacitors. Thus, if the contact points of chokes 4 are not distributed in a regular manner on the single chip 9, it can happen that the potentials of the coatings of capacitors 5 are not identical.

Figure 4:
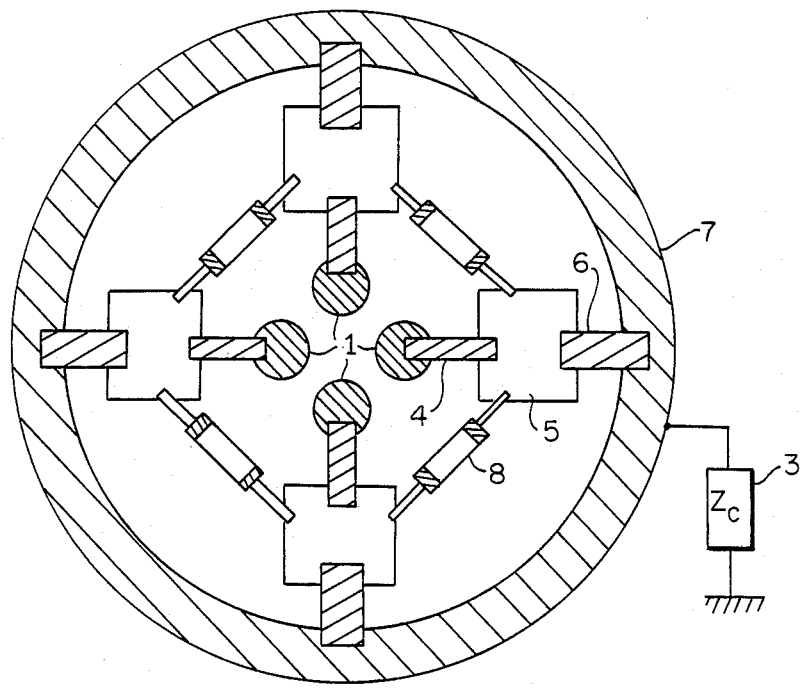
FIG. 4 a plan view of a combiner according to the invention as in FIG. 2.
Figure 5:
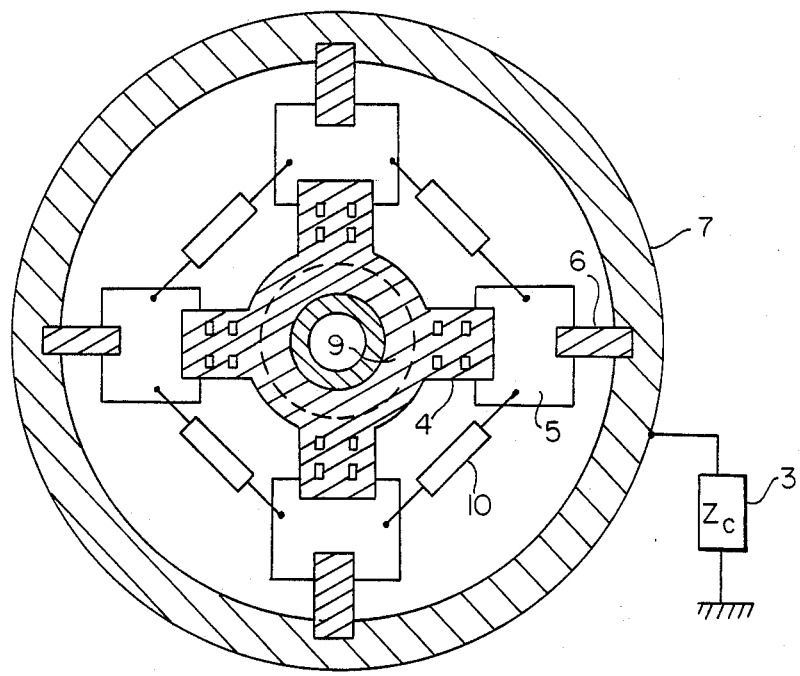
FIG. 5 a plan view of a combiner according to the invention as in FIG. 3.

FIGS. 4 and 5 show two more detailed plan views of the diagrams of FIGS. 2 and 3 respectively. However, with a view to facilitating the understanding of FIGS. 4 and 5, the various substrates and supports to which the combiner components are fixed have been deleted and appear in FIG. 6.

Thus, FIG. 4 corresponds to a plan view of the installation of unitary components according to FIG. 2. A certain number of semiconductor chips 1 (there are four in the drawing, but this in no way limits the scope of the invention) are fixed to the center of a circular device, whose periphery is limited by a dielectric material ring 7. Between the semiconductor chips 1 and the dielectric material ring 7 forming part of the encapsulation box are fixed the same number of unitary block capacitors 5 as there are semiconductor chips 1. Each chip 1 is connected to each capacitor 5 by a wire or, in the case of high frequency, preferably by a metal tape 4, which forms a choke (from parasitic inductance). Each capacitor 5 is connected to the outer ring 7 by a wire or a tape 6 forming a choke (from parasitic inductance).

The device is able to function in the manner described hereinbefore, however, for balancing the powers, it is preferable to place resistive elements 8 between the metallizations of capacitors 5 and said elements are generally constituted by metal layers deposited on a ceramic substrate. The description of a combiner, like that of FIG. 4, will be completed hereinafter relative to FIG. 6.

FIG. 5 shows a second embodiment of the combiner according to the invention where, as in FIG. 3, the semiconductor chips have been integrated into a single chip 9 with an equivalent surface. As chip 9 is fixed to the center of a circular support, capacitors 5 are regularly fixed around said central chip, as if it was a case of a plurality of elementary semiconductor chips 1, in order to distribute the energy. A capacitor 7, in the form of a dielectric material ring, is fixed concentrically to circular chip 9 and acts as an encapsulation box for the combiner.

The electrical connection and the corresponding chokes 4 between annular chip 9 and capacitors 5 are provided either by tapes, as in the case of FIG. 4, or by a part precut to the shape of a cross, as shown in FIG. 5. Such a part has the advantage of ensuring better contacting with annular chips 9 and the arms of the cross are advantageously cut to give a certain flexibility, so that they can more easily be heat sealed to the chip on the one hand and the capacitor 5 on the other. The fact that these arms are perforated and are in the form of a grid makes it possible, once the combiner has been assembled, to adjust its frequency by chemically etching the chip. Between the capacitor blocks 5 and the circular capacitor 7, the chokes are provided by metal tapes 6, as in the case of the previous drawings.

In view of the fact that in the present case, the plurality of elementary chips 1 is replaced by a single chip 9, it is no longer possible for there to be any difference between the characteristics of the chips. Therefore, the ballast resistors 8 arranged between the cathodes of the diodes are no longer necessary. However, it is possible that the choke 4 which contacts an annular diode 9 is not strictly centered, so that certain potential differences appear. It is therefore advantageous, but not necessary, for connecting wires 10 to produce the potential balance between capacitors 5.

Finally, as in the previous case, chokes 6 formed by metal tapes establish the contact between the first capacitor 5 and the second capacitor 7 for each cell of the combiner.

In the two cases of FIGS. 4 and 5, the energy supplied by the combiner according to the invention is collected on ring 7, which constitutes both the box, a capacitor and the energy collector, said energy being used in an external load 3.

Figure 6:
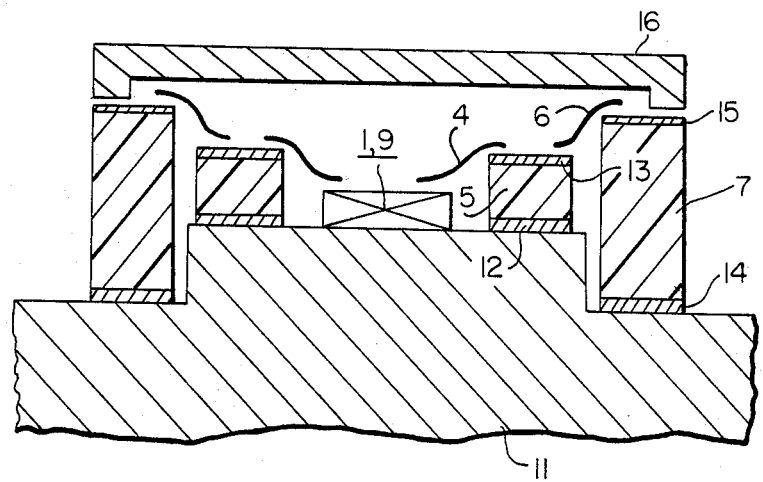
FIG. 6 sectional view of a combiner according to the invention.

FIG. 6 is a sectional view of a combiner according to the invention. This view applies in the case where a plurality of semiconductor chips is combined on a base and when the semiconductor devices are integrated into a single chip.

Either a plurality of elementary chips 1, or a single integrated chip 9 is fixed to a generally cylindrical metal base 11, which is made from copper or brass, so as to better dissipate the heat. Around said group of semiconductors, a certain number of capacitors 5 are fixed to the metal base 11. These capacitors are constituted by a dielectric material block carrying metallizations 12, 13 on two opposite faces. One of these metallizations, e.g. 12 is used for welding a capacitor to base 11. The other metallization, e.g. 13, makes it possible to receive chokes 4 and 6, which joint the semiconductor devices to capacitors 5 and 7.

A ceramic material ring 7 is fixed to the base concentrically to the semiconductors and to the capacitors. This ring is metallized on two opposite faces at 14 and 15, said faces being the planar faces of the ring. This ensures that the outer and inner cylindrical faces are not the metallized faces, because the capacitor will then be short-circuited during the welding of the ring to the base 12. The base is adapted to absorb part of the thickness differences between the semiconductor chip, the capacitors 5 and the ring 7. Viewed in secton, ring 7 must be slightly higher than capacitors 5, because the ring carries the metal cover 16 closing the box and to which is supplied the combiner bias.

Figure 7:
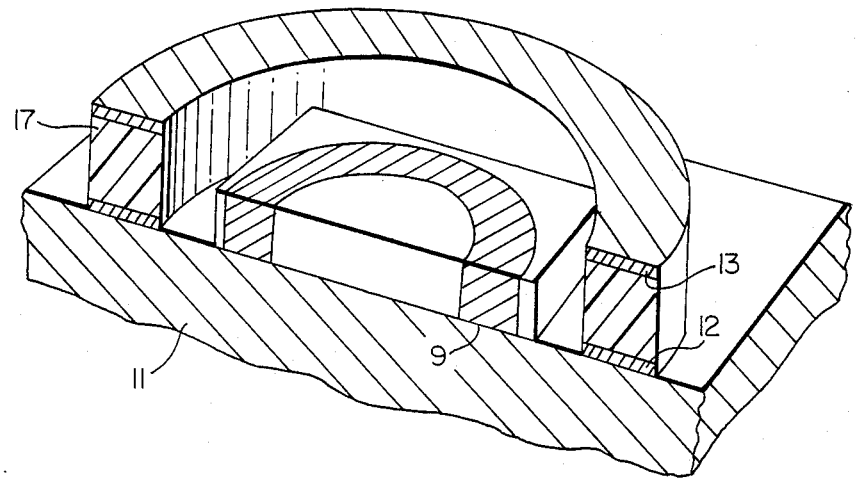
FIG. 7 a three quarter view in space of a variant of the combiner according to the invention, in which each of the semiconductor elements of the capacitors is integrated into a ring.

FIG. 7 is a partial three quarter view of a variant of the combiner according to the invention, in the case where a plurality of semiconductor devices is grouped onto a single diode of equivalent surface and integrated onto a single chip.

It has been stated that in this case, the diode is advantageously annular, because this shape makes it possible to obtain a better efficiency and dissipate more energy, the thermal characteristics of the diode being related to the mean diameter of the ring.

As in this case, there is only a single diode chip, it is no longer necessary to have more than a single impedance prematching cell with a single first capacitor and a single second capacitor. Thus, the plurality of capacitors 5 which, in the previous drawings, adapted an equivalent plurality of diodes, can be replaced by a single capacitor 17, which is in annular form and located between the single annular diode chip 9 and a second single annular capacitor 7, so that the combiner assumes a perfectly regular and balanced shape. The sectional view of such a combiner is also that of FIG. 6 and the three quarter view of FIG. 7 must be completed, for obtaining a combiner according to the invention, by the necessary metallizations, i.e. chokes 4 and 6 and ceramic ring 7, which, with a cover 16, form the encapsulation box of a device according to the invention.

The dimensions of the combiner according to the invention make it possible to produce the same in the form of an integrated circuit on a chip of silicon or a material of group IIII-V, such as GaAs.

The diode semiconductor devices are produced according to the state of the art and according to the type and characteristics required for the particular application. The capacitors, particularly capacitors 5, are produced in the form of MOS capacitors and the chokes in the form of appropriate surface metallizations of the semiconductor chip. It is then preferable to keep the second capacitor 7 in the form of a dielectric material rings, which cooperates in forming the integrated circuit encapsulation box.

The combiner according to the invention is in the form of a cylindrical copper or base element having on one of its ends, a matching microbox, whose metal cover 16 is used for supplying the bias polarization. This element is tight and can be fitted in different devices, such as waveguides or Kurokawa arrangements. Such a combiner is used in oscillator or amplifier arrangements, telecommunications equipment, radars or radiation-homing.

What is claimed is:

1. A compact combiner for semiconductor diodes operating in the ultra-high frequency range, and having circular symmetry, comprising:
a plurality of parallel connected semiconductor diodes each of which is affixed to a common surface of a metal base, each diode being adjacent at least one other diode, an impedance pre-matching cell associated with each diode, each pre-matching cell being formed by two chokes in series and two capacitors in parallel, each capacitor being connected between a choke and ground, the first capacitor of each impedance pre-matching cell being a discrete element fixed to the base, and the second capacitor, which is common to all the impedance pre-matching cells being formed by a dielectric material ring which is metallized on two opposite planar faces, and which is fixed to the base so that it is concentric to the combiner and encircles said diodes, chokes, and first capacitors, said chokes being parasitic chokes which are formed by metal tapes which are thermally compressed between the chip and the first capacitor for the first choke and between the first and second capacitors for the second choke, and said diodes being located in the center area of the base, and the chokes and first capacitors extending radially from said diodes in a symmetrical configuration wherein the chokes and first capacitors extending from each diode are equidistant from the chokes and first capacitors associated with adjacent diodes.

2. A compact combiner according to claim 1, wherein the combiner combines the energy of a plurality of diodes in elementary chips.

3. A compact combiner according to claim 1, wherein a plurality of diodes is integrated into a single annular chip, the chip having a surface equivalent to the surface of a plurality of diodes.

4. A compact combiner according to claim 1, wherein ballast resistors are connected between the first capacitors of each impedance matching cell.

5. A compact combiner according to claim 4, wherein balancing chokes are connected between the first capacitors of each impedance matching cell.

6. A compact combiner according to claim 3, wherein said plurality of first capacitor is integrated into a single annular capacitor.

7. A compact combiner according to claim 1, wherein the ring-like capacitor welded to the base forms the encapsulation box of the combiner for receiving a metal cover by which the bias to the combiner is supplied.

8. A compact combiner according to claim 1, wherein the combiner is produced in integrated form on a semiconductor material chip, the capacitors being MOS capacitors and the chokes being surface metallizations of the monolithic chip.

* * * * *

UNITED STATES PATENT AND TRADEMARK OFFICE
CERTIFICATE OF CORRECTION

PATENT NO.   :   4,839,712
DATED        :   June 13, 1989
INVENTOR(S)  :   Mamodaly, et al.

It is certified that error appears in the above-identified patent and that said Letters Patent is hereby corrected as shown below:

On the title page, item [63], in the section entitled "Related U.S. Application Data" the filing date of Serial No. 721,745 should be --April 10, 1985--.

Signed and Sealed this

Twentieth Day of February, 1990

*Attest:*

JEFFREY M. SAMUELS

*Attesting Officer*     *Acting Commissioner of Patents and Trademarks*